United States Patent
Song et al.

(10) Patent No.: US 8,633,565 B2
(45) Date of Patent: Jan. 21, 2014

(54) SEMICONDUCTOR DEVICE INCLUDING FUSE HAVING FORM OF CAPACITOR

(75) Inventors: Ho-Ju Song, Seoul (KR); Seong-Ho Kim, Seoul (KR); Won-Mo Park, Seongnam-si (KR); Gil-Sub Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 568 days.

(21) Appl. No.: 12/840,375

(22) Filed: Jul. 21, 2010

(65) Prior Publication Data

US 2011/0049670 A1 Mar. 3, 2011

(30) Foreign Application Priority Data

Sep. 1, 2009 (KR) .................. 10-2009-0081980

(51) Int. Cl.
*H01L 29/93* (2006.01)
(52) U.S. Cl.
USPC ................ 257/529; 257/532; 257/E29.325
(58) Field of Classification Search
USPC ............... 257/529–532, E29.325, 528
See application file for complete search history.

(56) References Cited

U.S. PATENT DOCUMENTS

2008/0001250 A1* 1/2008 Ichimura et al. ............ 257/529

FOREIGN PATENT DOCUMENTS

| JP | 2002-334928 | 11/2002 |
| JP | 2008-010757 | 1/2008 |
| KR | 1020020008461 | 7/2000 |

OTHER PUBLICATIONS

English Abstract for Publication No. 1020020008461.
English Abstract for Publication No. 2002-334928.
English Abstract for Publication No. 2008-010757.

* cited by examiner

*Primary Examiner* — Jack Chen
(74) *Attorney, Agent, or Firm* — F. Chau & Associates, LLC

(57) ABSTRACT

A semiconductor device includes a fuse having the form of a capacitor. The semiconductor device includes a cathode formed on a semiconductor substrate, an anode formed over the cathode, and at least one filament having a cylindrical-shell shape formed between the cathode and the anode and electrically connecting the cathode and the anode.

20 Claims, 10 Drawing Sheets

SEMICONDUCTOR DEVICE INCLUDING FUSE HAVING FORM OF CAPACITOR

CROSS-REFERENCE TO RELATED APPLICATIONS

This application claims the benefit of Korean Patent Application No. 10-2009-0081980, filed on Sep. 1, 2009, in the Korean Intellectual Property Office, the disclosure of which is incorporated herein in its entirety by reference.

BACKGROUND

1. Technical Field

The inventive concept relates to a semiconductor device including a fuse, and more particularly, to a semiconductor device including a fuse having the form of a capacitor.

2. Discussion of the Related Art

In the fabrication of semiconductor memory devices, it is common to have a memory device with one or more defective memory cells. Rather than discarding the entire memory device, defective memory cells may usually be replaced by redundant memory cells that are included in the memory device for this very purpose. In this case, the defective memory cells may be electrically insulated from other memory cells by cutting conductive filaments with a laser or the like, or by melting the filaments using an overcurrent. These conductive filaments accordingly act as fuses that may be cut to electrically disconnect defective memory cells.

In order to form a fuse electrically connected to defective memory cells, an additional process of forming the fuse may be performed. Furthermore, the area of the fuse is large, and thus in a highly-integrated memory device, the fuse is inefficient with respect to the usage of space.

SUMMARY

The inventive concept provides a semiconductor device including a fuse in which an additional process of forming a fuse is not required and spatial efficiency may be achieved.

According to an aspect of the inventive concept, there is provided a semiconductor device including a cathode formed on a semiconductor substrate. An anode is formed over the cathode. At least one first filament having a cylindrical shape is formed between the cathode and the anode and electrically connects the cathode and the anode.

A ratio between the diameter of each of the at least one first filament and its length may be about 1:17 or about 1:23.

The semiconductor device may further include a dielectric layer formed in the at least one first filament. A molding portion may be formed as a side surface of the at least one first filament. A support portion may be formed on the molding portion and may support a side surface of the at least one first filament.

A ratio of a thickness of the at least one first filament to the thickness of the dielectric layer may be about 1.1:1 or about 1.5:1.

The at least one first filament may include titanium (Ti), titanium nitride (TiN), tantalum (Ta), tantalum nitride (TaN) or a combination thereof.

The dielectric layer may include a high-k dielectric material including a half bandgap oxide (HBO), a zirconium-aluminum composite oxide ZrO/AlO/ZrO (ZAZ), a hafnium oxide (HfO), an aluminum oxide (AlO) or a zirconium oxide (ZrO).

The semiconductor device may further include a conductive wiring pattern formed over the cathode and a conductive contact formed between the cathode and the conductive wiring pattern and electrically connecting the cathode and the conductive wiring pattern.

The semiconductor device may further include at least one second filament having a cylindrical shape, formed between the cathode and the conductive contact and electrically connecting the cathode and the conductive contact.

According to an aspect of the inventive concept, there is provided a semiconductor device including a cathode, an anode formed over the cathode, and at least one filament having a cylindrical shape, formed between the cathode and the anode. The at least one first filament electrically connects the cathode and the anode. The anode is connected to a portion of the at least one filament.

The semiconductor device may further include a dielectric layer formed in the at least one filament and a conductive plate filling the dielectric layer. The anode is connected to a portion of the at least one filament, a portion of the dielectric layer, and a portion of the conductive plate.

According to an aspect of the inventive concept, there is provided a semiconductor device including a capacitor and a fuse. The capacitor includes a lower electrode having a cylindrical shape and formed on a semiconductor substrate. An upper electrode is formed over the lower electrode. A first dielectric layer is formed between the lower electrode and the upper electrode. The fuse includes a cathode formed on the semiconductor substrate, an anode formed over the cathode, and at least one filament having a cylindrical shape formed between the cathode and the anode and electrically connecting the cathode and the anode.

The cathode may be connected to a bottom surface of the at least one filament and the anode may be connected to a portion of the at least one filament.

The filament may be formed at the same level as the lower electrode.

The filament and the lower electrode may be formed of the same material.

The filament and the lower electrode may be formed to have the same thickness.

The semiconductor device may further include a second dielectric layer formed in the at least one filament.

The first dielectric layer and the second dielectric layer may be formed of the same material.

The first dielectric layer and the second dielectric layer may be formed to have the same thickness.

The semiconductor device may further include a conductive plate formed to fill the second dielectric layer.

The upper electrode and the conductive plate may be formed of the same material.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EXEMPLARY EMBODIMENTS

Figure 1:
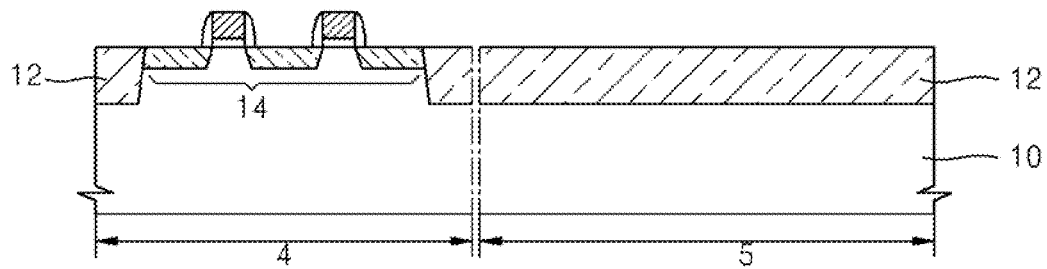
FIGS. 1 through 11 are cross-sectional views of a semiconductor device that is manufactured according to an exemplary embodiment of the inventive concept.

Exemplary embodiments of the inventive concept will now be described more fully with reference to the accompanying drawings. The inventive concept may, however, be embodied in many different forms and should not be construed as being limited to the exemplary embodiments set forth herein.

The terminology used herein is for the purpose of describing particular embodiments only and is not intended to be limiting of the invention.

Hereinafter, exemplary embodiments of the inventive concept will be described with reference to accompanying drawings. In the drawings, for example, illustrated shapes may be deformed according to fabrication technology and/or tolerances. Therefore, the exemplary embodiments of the inventive concept are not limited to certain shapes illustrated in the present specification, and may include modifications of shapes caused in fabrication processes.

FIGS. 1 through 11 are cross-sectional views of a semiconductor device that is manufactured according to an exemplary embodiment of the inventive concept. Referring to FIG. 1, an isolation layer 12 is formed on a semiconductor substrate 10. The semiconductor substrate 10 may be, for example, a silicon substrate, a silicon-germanium (Si—Ge) substrate or a silicon-on-insulation (SOI) substrate. The isolation layer 12 may be local oxidation of silicon (LOCOS) or shallow trench isolation (STI). Subsequently, a transistor 14 is formed in a cell region 4 of the semiconductor substrate 10.

Figure 2:
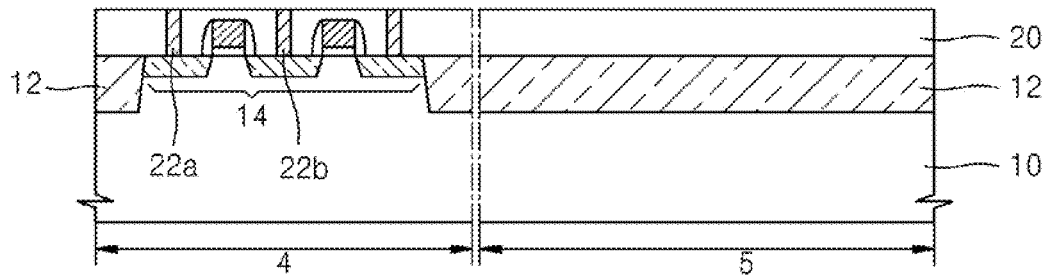

Referring to FIG. 2, a first interlayer insulation layer 20 is formed above the semiconductor substrate 10 where the transistor 14 is formed. The first interlayer insulating layer 20 may be, for example, a nitride layer, an oxide layer or an oxynitride layer and may be formed using a chemical vapour deposition (CVD) process. Subsequently, the first interlayer insulating layer 20 is patterned to form first layer conductive plugs 22a and 22b in the cell region 4. The first layer conductive plugs 22a and 22b may be formed by using, for example, a self aligned contact (SAC) process. The first layer conductive plugs 22a may be connected to a capacitor (not shown) and the first layer conductive plug 22b may be connected to a bit line (not shown).

Figure 3:
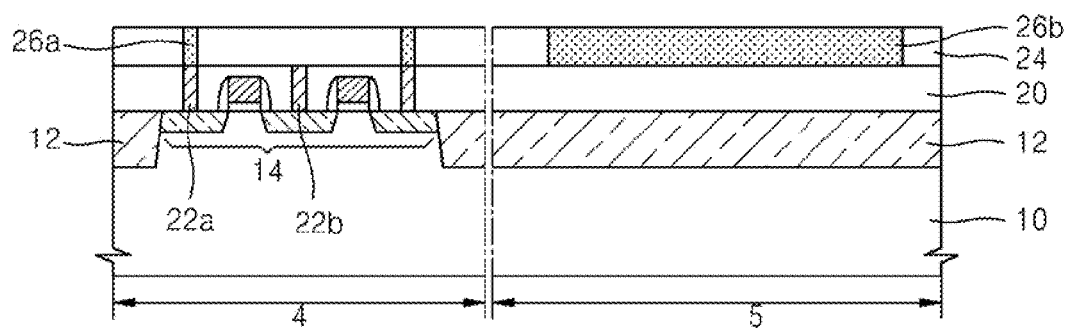

Referring to FIG. 3, a second interlayer insulating layer 24 is formed on the first interlayer insulating layer 20. The second interlayer insulating layer 24 may also be a nitride layer, an oxide layer or an oxynitride layer formed by using a CVD process and may have an etching selectivity with respect to the first interlayer insulating layer 20. Subsequently, the second interlayer insulating layer 24 is patterned to form second layer conductive plugs 26a in the cell region 4 and to form a second layer conductive line 26b in a fuse region 5. The fuse region 5 is a region in which a fuse is to be formed but the fuse is not limited to being formed within the fuse region 5 described herein, and the fuse may be formed in other regions. For example, the second layer conductive line 26b may be formed in the cell region 4.

Figure 4:
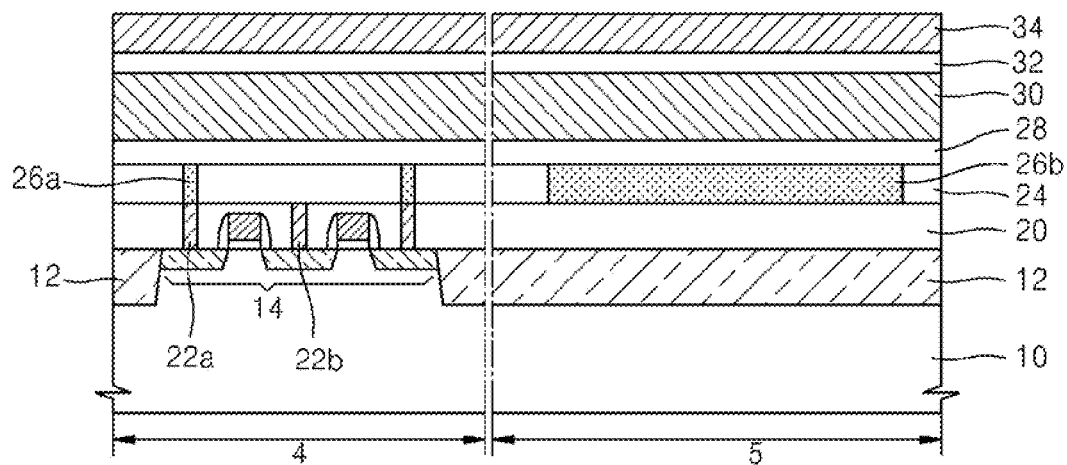

Referring to FIG. 4, a protection layer 28, a molding portion 30, a support portion 32, and a buffer layer 34 are sequentially formed on the second interlayer insulating layer 24. The protection layer 28 is an etch stopper for preventing the second interlayer insulating layer 24, the second layer conductive plug 26a and the second layer conductive line 26b from, being etched, and may be formed, for example, of silicon nitride (SiN). The molding portion 30 is a mold oxide for forming a cylindrical capacitor (not shown) and the fuse (not shown) and may be formed of silicon oxide (SiO). The support portion 32 may be formed of SiN for supporting lower electrodes (not shown) of the capacitor, when the molding portion 30 is removed before upper electrodes (not shown) are formed and after the lower electrodes of the capacitor and dielectric layers (not shown) are formed. The buffer layer 34 may be formed of SiO. The support portion 32 may have an etching selectivity with respect to the molding portion 30 and the buffer layer 34.

Figure 5:
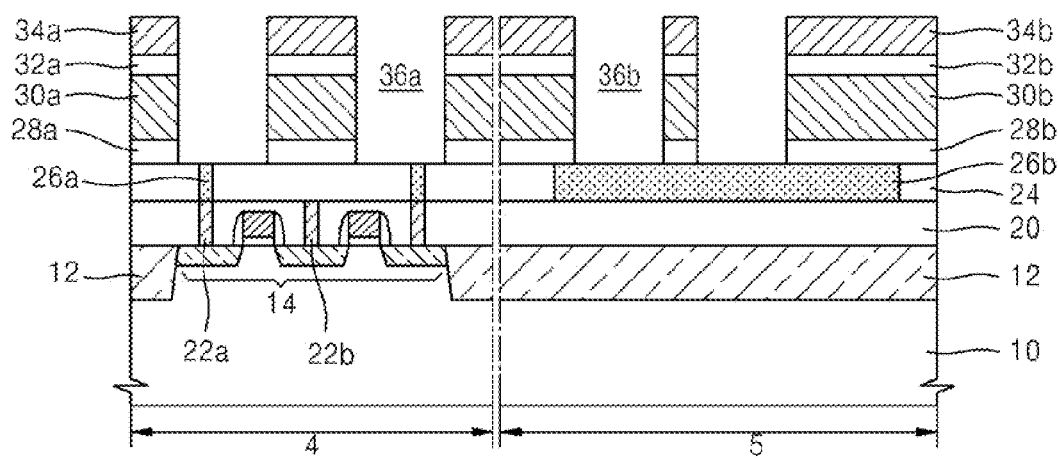

Referring to FIG. 5, protection layers 28a and 28b, molding portions 30a and 30b, support portions 32a and 32b, and buffer layers 34a and 34b are patterned and etched to form capacitor holes 36a and fuse holes 36b substantially simultaneously. A process of forming the capacitor and a process of forming the fuse are performed substantially simultaneously.

Figure 6:
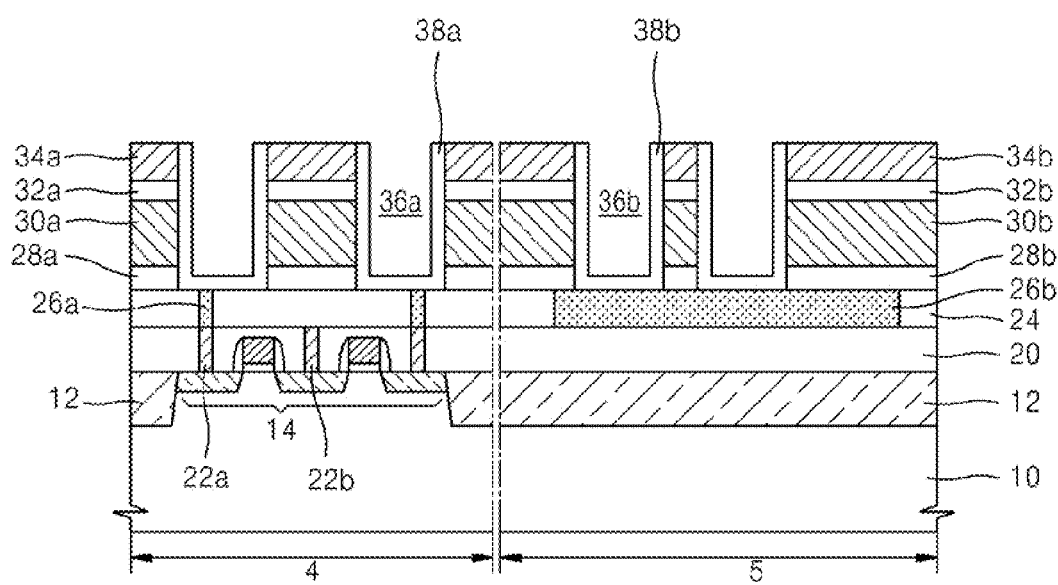

Referring to FIG. 6, lower electrodes 38a and 38b that are at the same level are formed in each capacitor hole 36a and in each fuse hole 36b. The lower electrodes 38a and 38b may be cylindrical-shell shaped. As used herein, the term cylindrical-shell shaped may be understood to be a shape of a substantially hollow cylinder without regard to whether or not the top and bottom are opened or closed. The lower electrode 38b of FIG. 6 is shown as having an open top and a closed bottom and referring to FIG. 14A, the lower electrode 38b is shown as having a wall thickness X. The lower electrodes 38a and 38b may include, for example, titanium (Ti), titanium nitride (TiN), tantalum (Ta), tantalum nitride (TaN) or combinations thereof. The lower electrodes 38a may be formed in the cell region 4 and the lower electrodes 38b may be formed in the fuse region 5, and the lower electrodes 38a and 38b may each be formed of the same material and may each have the same thickness.

Figure 7:
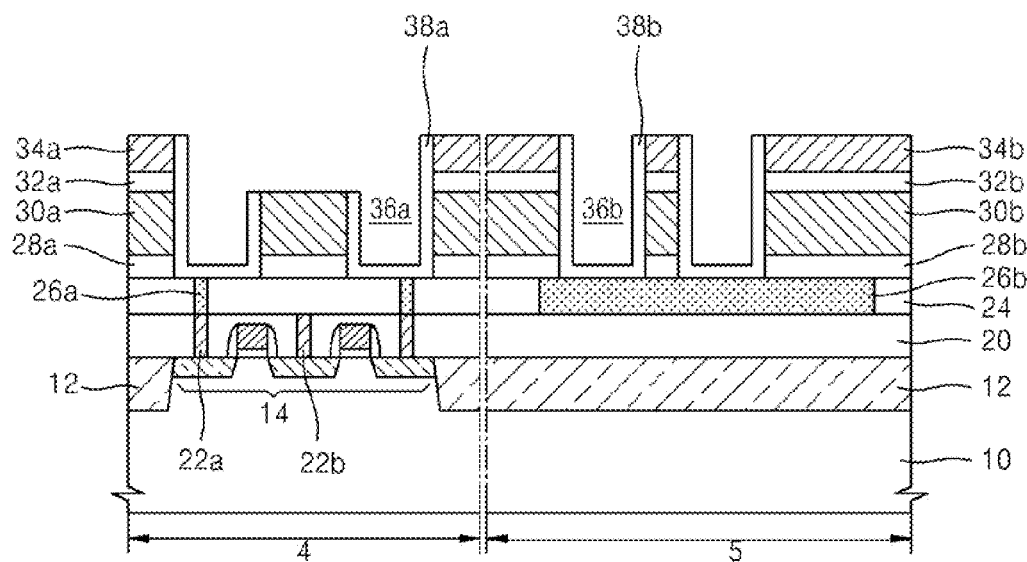

Referring to FIG. 7, the buffer layer 34a and the support portion 32a between two capacitor holes 36a formed in the cell region 4 are patterned and etched. The buffer layer 34b and the support portion 32b may be covered by using a mask (not shown) when a photolithographic process is performed, and thus are not etched.

Figure 8:
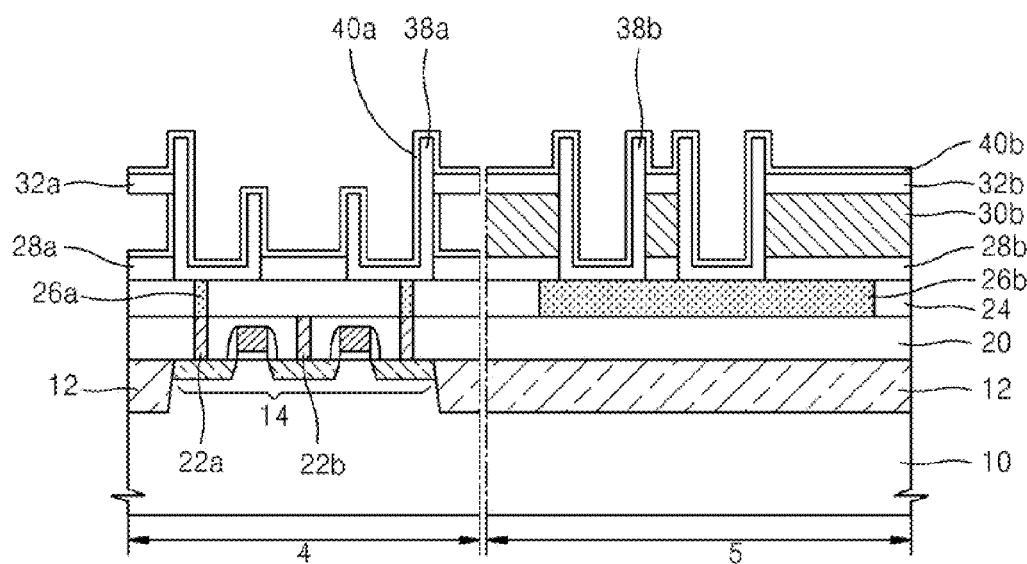

Referring to FIG. 8, the molding portion (30a and 30b of FIG. 7) formed in the cell region 4 and the fuse region 5, respectively, and the buffer layers (34a and 34b of FIG. 7) formed in the cell region 4 and the fuse region 5, respectively, are removed. A lift-off process using hydrogen fluoride (HF) or limulus amebocyte lysate (LAL) may be performed to remove the molding portion (30a of FIG. 7). The support portion (32a of FIG. 7) formed between the two capacitor holes 36a is removed from the cell region 4 so that the buffer layer (34a of FIG. 7) and the molding portion (30a of FIG. 7) surrounding the lower electrodes 38a of the capacitor may be removed. On the other hand, the support portion (32b of FIG. 7) formed between two fuse holes 36b remains in the fuse region 5, and thus, only the buffer layer (34b of FIG. 7) are removed.

Subsequently, dielectric layers 40a and 40b are formed on the lower electrodes 38a and 38b, the support portions 32a and 32b, and the protection layer 28a. The dielectric layers 40a and 40b may include a high-k dielectric material including a half bandgap oxide (HBO), a zirconium-aluminum composite oxide ZrO/AlO/ZrO (ZAZ), a hafnium oxide (HfO), an aluminum oxide (MO) or a zirconium oxide (ZrO). The dielectric layer 40a may be formed in the cell region 4, and the dielectric layer 40b may be formed in the fuse region 5. The dielectric layers 40a and 40b may each be formed of the same material and may each have the same thickness.

Figure 9:
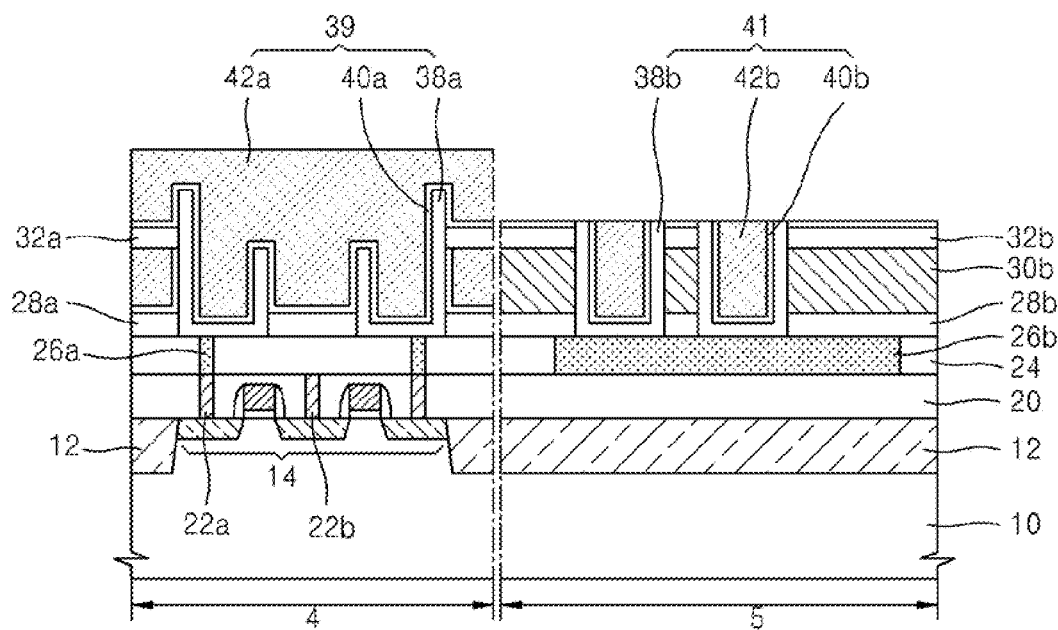

Referring to FIG. 9, upper electrodes 42a and conductive plates 42b are formed on the dielectric layers 40a and 40b, respectively. The upper electrodes 42a and the conductive plates 42b may each be formed of the same material. Subsequently, the lower electrodes 38b formed in the fuse region 5 may be insulated from each other via patterning. A chemical mechanical polishing (CMP) process or an etchback process is performed on the conductive plates 42b so that the lower electrodes 38b formed in the fuse region 5 may be electrically insulated from each other, and thus, the dielectric layer 40b formed on the support portion 32b may be exposed.

Figure 10:
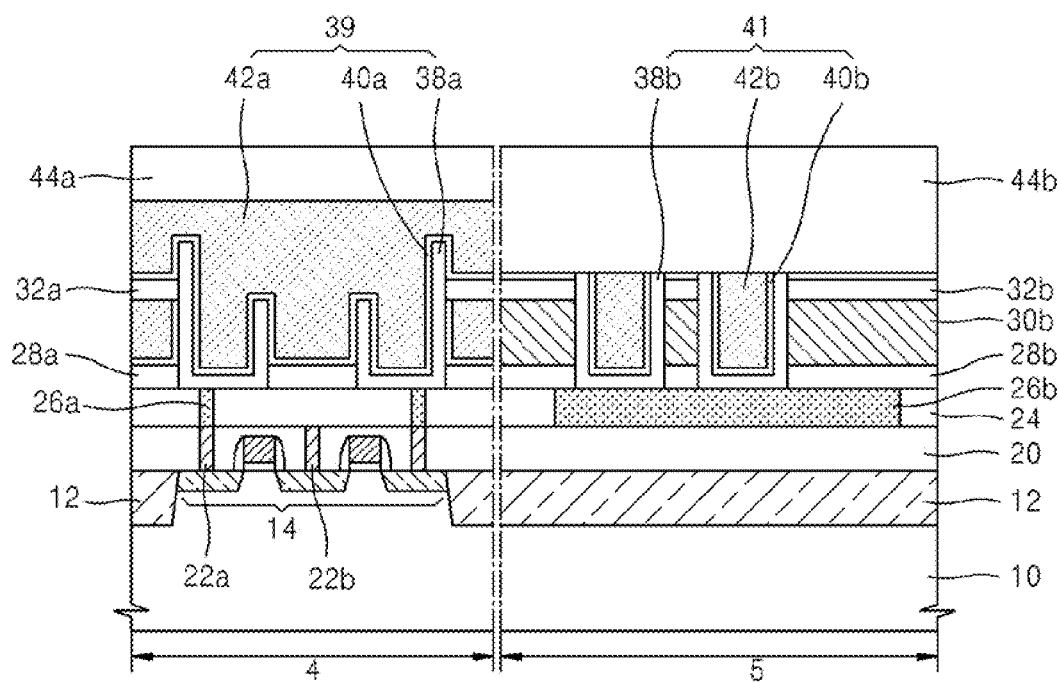

Referring to FIG. 10, third interlayer insulating layers 44a and 44b are formed on a capacitor 39 and a filament 41 having the form of a capacitor.

Figure 11:
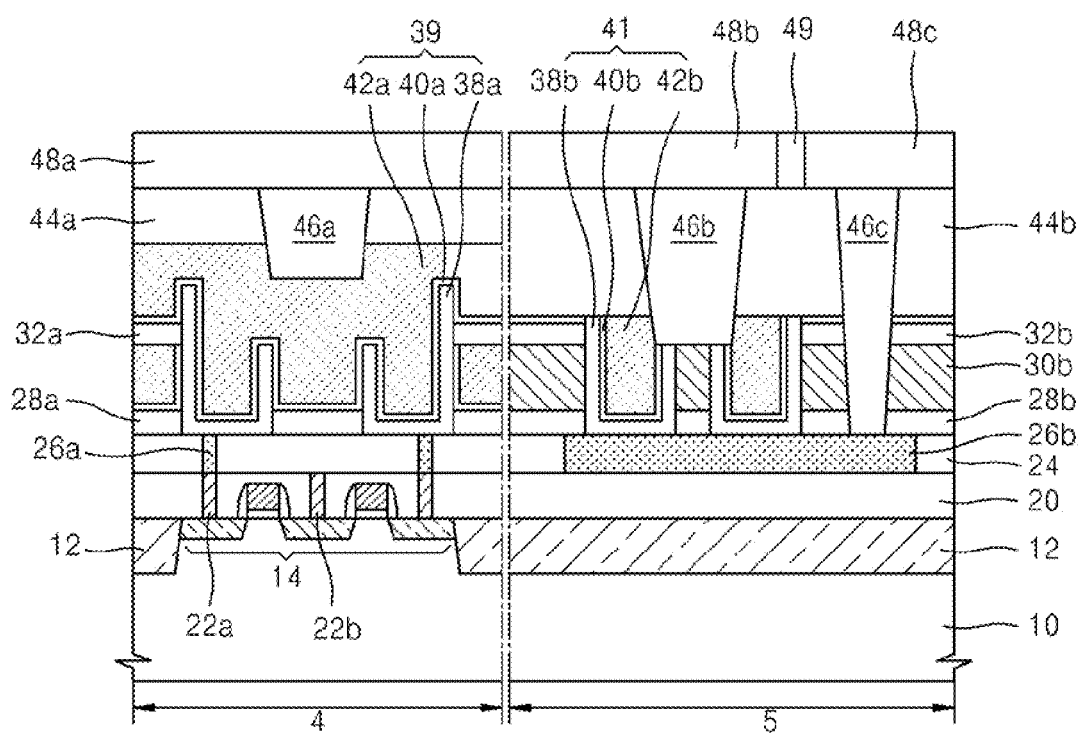

Referring to FIG. 11, the third interlayer insulating layers 44a and 44b are patterned to form conductive contacts 46a, 46b, and 46c. The third interlayer insulating layers 44a and 44b are dry/wet etched isotropically and/or anisotropically to form the conductive contacts 46a, 46b, and 46c each having a substantially rectangular shape, an oval shape, a triangular or a trapezoidal shape in cross-section. Subsequently, a fourth interlayer insulating layer 49 is formed on the conductive contacts 46a, 46b, and 46c, and conductive wiring patterns 48a, 48b, and 48c that are electrically connected to the conductive patterns 46a, 46b, and 46c are formed via patterning.

A semiconductor device including the filament 41 having the form of a capacitor may include the second layer conductive line 26b formed above the semiconductor substrate 10, the conductive contact 46b formed above the conductive line 26b, and two lower electrodes 38b that are formed between the second layer conductive line 26b and the conductive contact 46b and electrically connecting the conductive line 26b and the conductive contact 46b. Thus, a fuse in which the conductive contact 46b serves as an anode, the conductive line 26b serves as a cathode and the two lower electrodes 38b serve as a filament may be formed.

The filament 41 having the form of a capacitor may be formed in the fuse region 5 when forming the capacitor 39 in the cell region 4. Thus, according to an exemplary embodiment of the inventive concept, a process of forming the fuse may be more easily performed when compared to a planar pattern fuse that requires an additional process of forming poly and silicide.

Furthermore, the planar pattern fuse has a planar structure, and the filament 41 having the form of a capacitor has a vertical structure having a high aspect ratio, for example, the length of the filament 41 may exceed the diameter thereof. Thus, the area of the fuse may be half or less than half the area of the planar pattern fuse. As a result, spatial efficiency of the fuse in the semiconductor device may be increased.

The fuse including the filament 41 having the form of a capacitor may prevent Cu, which is normally used to form vias and metal lines, from being electromigrated via poly in the conventional planar pattern fuse, and thus reliability of the fuse in the semiconductor device may be increased.

The process of fabricating the semiconductor device of FIG. 1 through 11 shows a procedure in which the capacitor 39 and the fuse are formed in a dynamic random access memory (DRAM) in the same process. However, the fuse according to the inventive concept is not limited to only the DRAM and may be included in a volatile memory device such as a static random access memory (SRAM) or a synchronous dynamic random access memory (SDRAM), or a nonvolatile memory device such as a read only memory (ROM), a programmable read-only memory (PROM), an erasable PROM (EPROM), an electrically EPROM (EEPROM), a flash memory, a phase change access memory (PRAM), a magnetic random access memory (MRAM), a resistive RAM (RRAM), or a ferroelectric RAM (FRAM). Although not shown, for example, when a capacitor and a fuse are formed in volatile or non-volatile memory devices, a process of forming a cylindrical capacitor and a process of forming a fuse including a cylindrical filament may be simultaneously performed.

Figure 12:
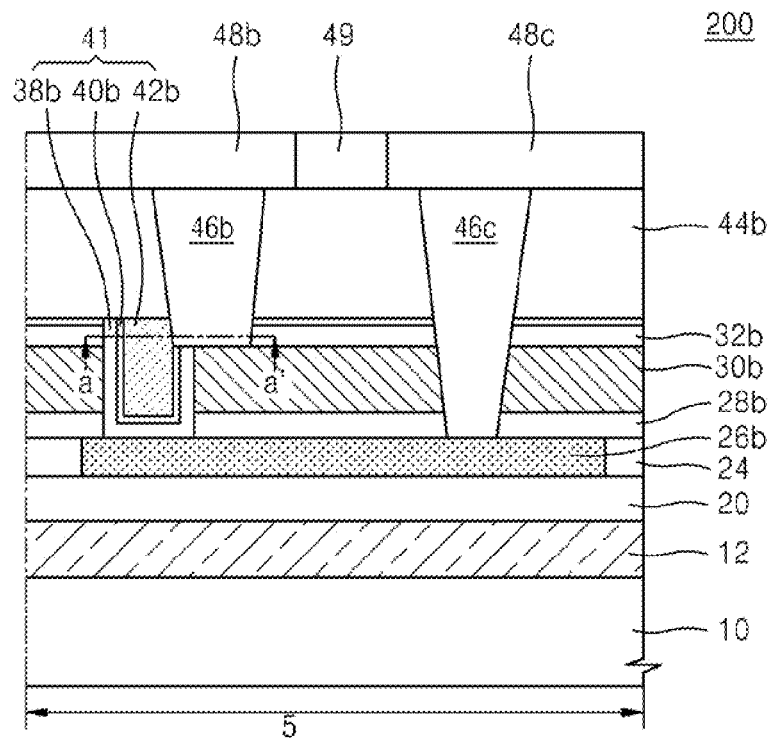
FIG. 12 is a schematic cross-sectional view of a semiconductor device according to an exemplary embodiment of the inventive concept.

FIG. 12 is a schematic cross-sectional view of a semiconductor device 200 according to an exemplary embodiment of the inventive concept. The semiconductor device 200 may be a modification of the semiconductor device of FIG. 11. Details not described below may be understood to be similar to those described above.

Referring to FIG. 12, the semiconductor device 200 includes a filament 41 having the form of a capacitor that may include a conductive line 26b formed above a semiconductor substrate 10, a conductive contact 46b formed above the conductive line 26b, and one lower electrode 38b that is formed between the conductive line 26b and the conductive contact 46b and electrically connecting the conductive line 26b and the conductive contact 46b. Thus, a fuse in which the conductive contact 46b serves as an anode, the conductive line 26b serves as a cathode and the one lower electrode 38b serves as a filament may be formed.

Figure 13:
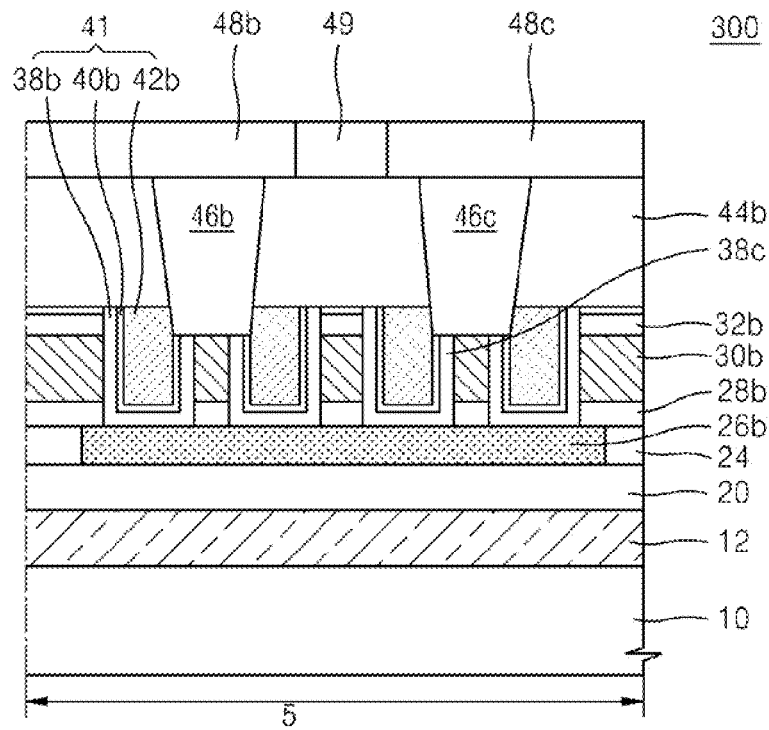
FIG. 13 is a schematic cross-sectional view of a semiconductor device according to an exemplary embodiment of the inventive concept.

FIG. 13 is a schematic cross-sectional view of a semiconductor device 300 according to an exemplary embodiment of the inventive concept. The semiconductor device 300 may be a modification of the semiconductor device of FIG. 11. Details not described below may be understood to be similar to those described above.

Referring to FIG. 13, the semiconductor device 300 includes a filament 41 having the form of a capacitor may include a conductive line 26b formed above a semiconductor substrate 10, first and second conductive contacts 46b and 46c formed above the conductive line 26b, and first and second lower electrodes 38b and 38c (not labeled) that are formed between the conductive line 26b and the first and second conductive contacts 46b and 46c and electrically connecting the conductive line 26b and the first and second conductive contacts 46b and 46c, respectively. Thus, two fuses in which the first and second conductive contacts 46b and 46c serve as an anode, the conductive line 26b serves as a cathode and the first and second lower electrodes 38b and 38c serve as a filament may be formed.

Figure 14A:
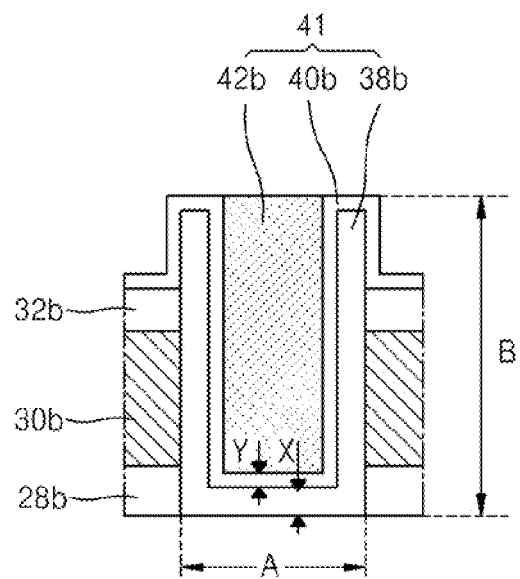
FIG. 14A is a schematic cross-sectional view of a filament having the form of a capacitor of FIG. 11 according to an exemplary embodiment of the inventive concept.
Figure 14B:
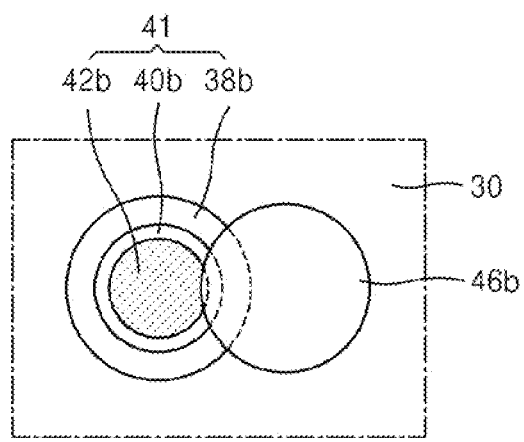
FIG. 14B is a plan view of the semiconductor device taken along a line a-a' of FIG. 12.

FIG. 14A is a schematic cross-sectional view of the filament 41 having the form of a capacitor of the FIG. 11 according to an exemplary embodiment of the inventive concept, and FIG. 14B is a plan view of the semiconductor device 200 taken along a line a-a' of FIG. 12.

Referring to FIG. 14A, an aspect ratio representing the ratio of a width (diameter) A to a length B of a lower electrode may be about 1:17 or about 1:23. A ratio of a thickness X of a lower electrode to a thickness Y of a dielectric layer may be 1.1:1 or 1.5:1. The thickness Y of the dielectric layer may be about 100 Å.

Referring to FIG. 14B, the filament 41 having the form of a capacitor in a cylindrical molding portion 30 includes the lower electrode 38b, the dielectric layer 40b, and the conductive plate 42b. The conductive contact 46b may be connected to a portion of a top surface of the lower electrode 38b, a portion of a top surface of the dielectric layer 40b, and a portion of a top surface of the conductive plate 42b. In particular, the conductive contact 46b may be electrically connected to portions of the top surface of the lower electrode 38b. Thus, the filament 41 having the form of a capacitor serves as a filament of a fuse, and the conductive contact 46b serves as an anode.

The area in which the portion of the top surface of the lower electrode 38b and the conductive contact 46b contact each other in the filament 41 having the form of a capacitor, may be changed in order to generate a fuse having a fusing bias voltage required for a design. Also, the dielectric layer 40b in the filament 41 having the form of a capacitor may be changed to vary the fusing bias voltage. Thus, the fuse may be flexibly designed and manufactured in the semiconductor device.

Figure 15:
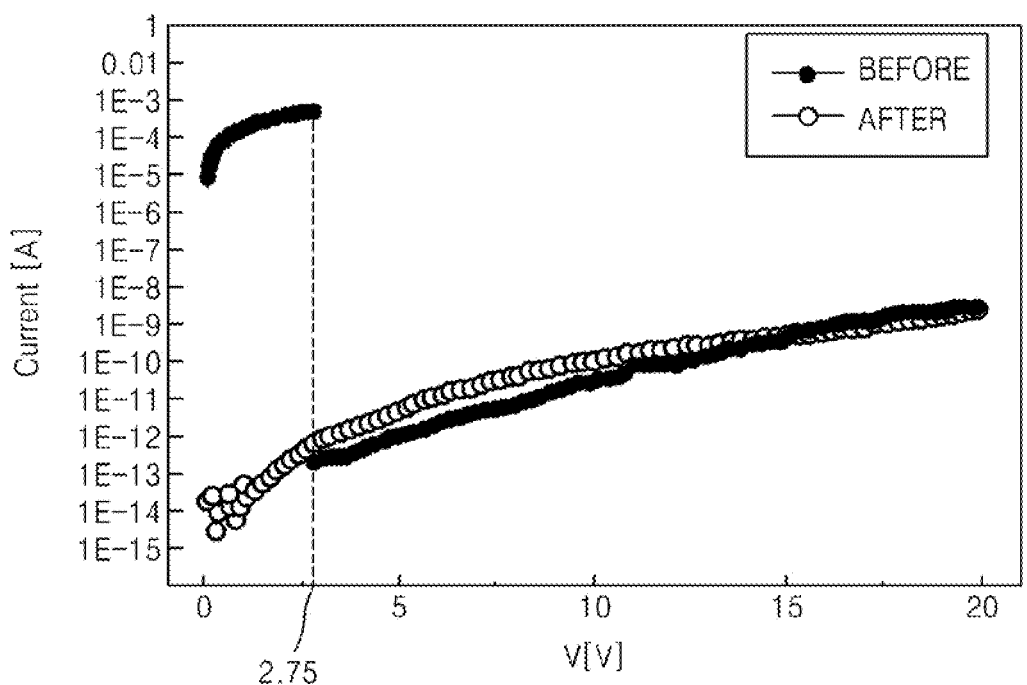
FIG. 15 is a graph showing rupture of the filament of FIG. 11 when a fusing bias voltage of the semiconductor device of FIG. 11 is increased past a specific fusing bias voltage.

FIG. 15 is a graph showing rupture of the filament 41 when a fusing bias voltage of the semiconductor device of FIG. 11 is increased past a specific fusing bias voltage. Referring to FIG. 15, the filament 41 is ruptured at a fusing bias voltage of about 2.75 V. After that, even when the fusing bias voltage is increased, a very low current flows through the filament 41, and thus, the filament 41 has been cut. Thus, a fuse may be formed in the same process as forming of a capacitor. If necessary, the aspect ratio of the lower electrode 38b and the dielectric layer 50b in the filament 41 may be changed to generate a desired fusing bias voltage.

Figure 16:
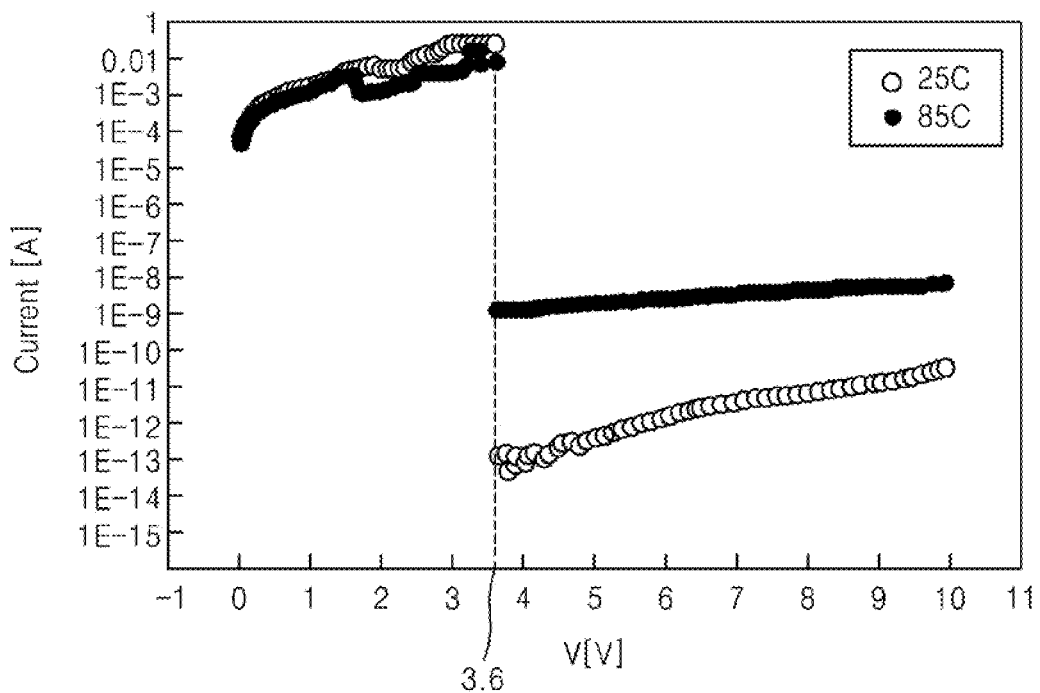
FIG. 16 is a graph showing rupture of the filament of FIG. 11 at different temperatures when a fusing bias voltage of the semiconductor device of FIG. 11 is changed.

FIG. 16 is a graph showing rupture of the filament 41 at different temperatures when a fusing bias voltage of the semiconductor device of FIG. 11 is increased past a specific fusing bias voltage. Referring to FIG. 16, the filament 41 is ruptured at a fusing bias voltage of about 3.6 V at 25° C. and 85° C. Thus, the ruptured fusing bias voltage is not affected by temperature.

Figure 17:
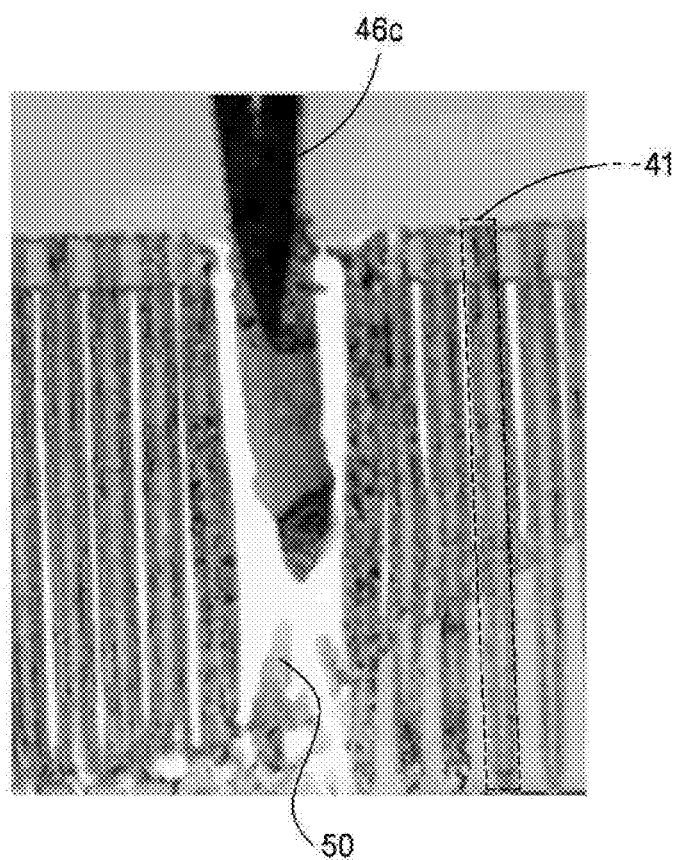
FIG. 17 is a transmission electron microscope image of the semiconductor device of FIG. 11 after the filament is ruptured.

FIG. 17 is a transmission electron microscope image of the semiconductor device of FIG. 11 after the filament 41 has ruptured.

Referring to FIG. 17, the filament 41 having the form of a plurality of capacitors is formed in the fuse region 5. The filament 41 may be ruptured due to a fusing bias voltage so that the filament 41 having the form of two capacitors connected to the conductive contact 46c may be cut. A cut filament 50 electrically separates defective memory cells from functional cells.

While the inventive concept has been particularly shown and described with reference to exemplary embodiments thereof, it will be understood that various changes in form and details may be made therein without departing from the inventive concept.

What is claimed is:

1. A semiconductor device comprising:
   a cathode formed on a semiconductor substrate;
   an anode formed over the cathode; and
   at least one first filament having a cylindrical-shell shape, formed between the cathode and the anode and electrically connecting the cathode and the anode,
   wherein the at least one first filament is non-concentric with the anode and the anode only partially overlaps the filament.

2. The semiconductor device of claim 1, wherein the semiconductor device is a solid-state memory device and the at least one first filament is a fuse between a potentially defective memory cell of the solid-state memory device and a remainder of the solid-state memory device such that when the potentially defective memory cell is determined to be defective, the filament is severed and an electrical connection between the cathode and the anode is broken and the defective memory cell is electrically disconnected from the remainder of the solid-state memory device.

3. The semiconductor device of claim 1, wherein a diameter of the at least one first filament is less than a length of the at least one first filament.

4. The semiconductor device of claim 1, wherein a ratio between a diameter of the at least one first filament and a length of the at least one first filament is about 1:17 or about 1:23.

5. The semiconductor device of claim 1, further comprising:
   a dielectric layer formed in the at least one first filament;
   a molding portion formed as a side surface of the at least one first filament; and
   a support portion formed on the molding portion and supporting a side surface of the at least one first filament.

6. The semiconductor device of claim 5, wherein a ratio of a thickness of the at least one first filament to the thickness of the dielectric layer is about 1.1:1 or about 1.5:1.

7. The semiconductor device of claim 5, wherein the dielectric layer comprises one or more of a high-k dielectric material comprising a half bandgap oxide (HBO), a zirconium-aluminum composite oxide ZrO/AlO/ZrO (ZAZ), a hafnium oxide (HfO), an aluminum oxide (AlO), or a zirconium oxide (ZrO).

8. The semiconductor device of claim 1, wherein the at least one first filament comprises one or more of titanium (Ti), titanium nitride (TiN), tantalum (Ta), tantalum nitride (TaN), or a combination thereof.

9. The semiconductor device of claim 1, further comprising: a conductive wiring pattern formed over the cathode; and a conductive contact formed between the cathode and the conductive wiring pattern and electrically connecting the cathode and the conductive wiring pattern.

10. The semiconductor device of claim 9, further comprising at least one second filament having a cylindrical-shell shape, formed between the cathode and the conductive contact and electrically connecting the cathode and the conductive contact.

11. A semiconductor device comprising:
    a cathode;
    an anode formed over the cathode; and
    at least one filament having a cylindrical-shell shape, formed between the cathode and the anode and electrically connecting the cathode and the anode, wherein the anode is connected to a portion of the at least one filament,
    wherein the at least one first filament is non-concentric with the anode and the anode only partially overlaps the filament.

12. The semiconductor device of claim 11, further comprising:
    a dielectric layer formed in the at least one filament; and
    a conductive plate formed to fill the dielectric layer, wherein the anode is connected to a portion of the at least one filament, a portion of the dielectric layer, and a portion of the conductive plate.

13. A semiconductor device comprising a capacitor and a fuse, wherein the capacitor comprises:
    a lower electrode having a cylindrical-shell shape and formed on a semiconductor substrate;
    an upper electrode formed over the lower electrode; and a first dielectric layer formed between the lower electrode and the upper electrode, and wherein the fuse comprises:

a cathode formed on the semiconductor substrate;

an anode formed over the cathode; and at least one filament having a cylindrical-shell shape, formed between the cathode and the anode and electrically connecting the cathode and the anode, wherein the at least one first filament is non-concentric with the anode and the anode only partially overlaps the filament.

14. The semiconductor device of claim 13, wherein the cathode is connected to a bottom surface of the at least one filament, and the anode is connected to a top portion of the at least one filament.

15. The semiconductor device of claim 13, wherein the filament is formed at the same level as the lower electrode.

16. The semiconductor device of claim 13, wherein the filament and the lower electrode are formed of the same material.

17. The semiconductor device of claim 13, wherein the filament and the lower electrode have the same thickness.

18. The semiconductor device of claim 13, further comprising a second dielectric layer formed in the at least one filament, wherein the first dielectric layer and the second dielectric layer are formed of the same material.

19. The semiconductor device of claim 18, wherein the first dielectric layer and the second dielectric layer have the same thickness.

20. The semiconductor device of claim 18, further comprising a conductive plate filling the second dielectric layer, wherein the upper electrode and the conductive plate are formed of the same material.

* * * * *